US011563431B1

(12) United States Patent
Shen

(10) Patent No.: US 11,563,431 B1
(45) Date of Patent: Jan. 24, 2023

(54) REVERSE CURRENT SUPPRESSION CIRCUIT FOR PMOS TRANSISTOR

(71) Applicant: Wuxi Crystal Source Microelectronics Co., Ltd., Wuxi (CN)

(72) Inventor: Hua Shen, Wuxi (CN)

( * ) Notice: Subject to any disclaimer, the term of this patent is extended or adjusted under 35 U.S.C. 154(b) by 0 days.

(21) Appl. No.: 17/816,251

(22) Filed: Jul. 29, 2022

(30) Foreign Application Priority Data

Aug. 13, 2021 (CN) .......................... 202110934157.1

(51) Int. Cl.
*H03K 17/082* (2006.01)

(52) U.S. Cl.
CPC ................................ *H03K 17/0822* (2013.01)

(58) Field of Classification Search
CPC .................................................. H03K 17/0822
See application file for complete search history.

(56) References Cited

U.S. PATENT DOCUMENTS

| 7,248,450 | B1* | 7/2007 | Dempsey | ............ | H01L 27/0251 |
| | | | | | 361/10 |
| 2004/0239403 | A1* | 12/2004 | Farley | ................ | H03K 17/0822 |
| | | | | | 327/437 |
| 2007/0127182 | A1* | 6/2007 | Chang | ................ | H03K 17/0822 |
| | | | | | 361/100 |
| 2013/0063116 | A1* | 3/2013 | Sun | ...................... | H03K 17/302 |
| | | | | | 327/434 |

FOREIGN PATENT DOCUMENTS

| CN | 1842957 | A | 10/2006 |
| CN | 101453157 | A | 6/2009 |
| CN | 102684167 | A | 9/2012 |
| CN | 103001617 | A | 3/2013 |
| CN | 104104331 | A | 10/2014 |
| CN | 106786477 | A | 5/2017 |
| CN | 107612390 | A | 1/2018 |

(Continued)

OTHER PUBLICATIONS

International Search Report for corresponding PCT/CN2021/120975, dated May 24, 2022.

(Continued)

*Primary Examiner* — Pinping Sun
*Assistant Examiner* — Christopher J Clark
(74) *Attorney, Agent, or Firm* — Egbert, McDaniel & Swartz, PLLC

(57) ABSTRACT

A reverse current suppression circuit for a PMOS transistor, which includes: a gate drive unit, when the source potential of the first PMOS transistor is lower than the drain potential, the gate drive unit making the gate potential of the first PMOS transistor equal to the drain potential, so that the first PMOS transistor comes into a reverse current suppression state; and a substrate switching unit, when the source potential of the first PMOS transistor is lower than the drain potential, the substrate switching unit short-circuiting the substrate of the first PMOS transistor with the drain of the first PMOS transistor. According to the present invention, when the source potential of the PMOS transistor is lower than the drain potential, the PMOS transistor can be controlled to operate in the reverse current suppression state, so that the PMOS transistor can be effectively protected.

9 Claims, 5 Drawing Sheets

(56) References Cited

FOREIGN PATENT DOCUMENTS

| | | |
|---|---|---|
| CN | 109088532 A | 12/2018 |
| CN | 110149042 A | 8/2019 |
| CN | 111277256 A | 6/2020 |
| JP | 2000022517 A | 1/2000 |

OTHER PUBLICATIONS

Written Opinion of the International Searching Authority for corresponding PCT/CN2021/120975, dated May 24, 2022.
Official Action in Priority Application CN 202110934157.1, dated Mar. 1, 2022.
Supplementary Search Report in Priority Application CN 202110934157.1, dated Mar. 24, 2022.
Issue Notification / Decision to Grant in Priority Application CN 202110934157.1, dated Apr. 6, 2022.

\* cited by examiner

REVERSE CURRENT SUPPRESSION CIRCUIT FOR PMOS TRANSISTOR

CROSS-REFERENCE TO RELATED APPLICATIONS

Not applicable.

TECHNICAL FIELD

The present invention relates to a reverse current suppression circuit for a high voltage-withstanding thin gate oxide PMOS (P-channel Metal Oxide Semiconductor) transistor.

BACKGROUND

With the decrease of line width and gate oxide layer (gate oxide for short) thickness in integrated circuit manufacturing, the withstandable voltage between the gate and the substrate is decreased as well.

The thick gate oxide technology is generally adopted in the conventional manufacturing of high-voltage devices, that is, the gate oxide thickness of high-voltage devices is larger than that of low-voltage devices, and a high voltage between the gate and the substrate of such high-voltage devices can be withstood. This will decrease the transconductance (gm) of high-voltage devices, complicate the manufacturing process and increase the cost. For high-voltage devices adopting the thin gate oxide technology (that is, devices withstanding a high voltage between the drain and the source and devices withstanding a low voltage between the drain and the source have the same gate oxide thickness), the withstandable voltage between the gate and the substrate of the high-voltage devices is very low. In the process of application to an actual circuit, it is necessary to control the fluctuation of the voltage between the gate and the substrate of a high-voltage device in the circuit, so that the magnitude of the voltage can be kept within a working voltage range of the low-voltage control circuit.

In a circuit with high-voltage devices, the withstandable voltage between the drain and the source of a high voltage-withstanding thin gate oxide PMOS transistor is higher than that between the gate and the substrate. How to design a control circuit so that when the source potential of a PMOS transistor is lower than the drain potential, the PMOS transistor will operate in a reverse cut-off state (i.e. a reverse current suppression state) to realize effective protection for the high voltage-withstanding thin gate oxide PMOS transistor has become a technical problem to be solved urgently.

BRIEF SUMMARY

The objective of the present invention is to provide a reverse current suppression circuit for a high voltage-withstanding thin gate oxide PMOS transistor. When the source potential of the PMOS transistor is lower than the drain potential, the PMOS transistor can be controlled to operate in a reverse current suppression state, so that the PMOS transistor can be effectively protected.

Technical Solution for Realizing the Objective of the Present Invention

The present invention relates to a reverse current suppression circuit for a high voltage-withstanding thin gate oxide PMOS transistor, which includes a first PMOS transistor. The reverse current suppression circuit includes:

a gate drive unit, the first signal output end of the gate drive unit being connected to the source of the first PMOS transistor, the second signal output end being connected to the gate of the first PMOS transistor, and the third signal output end being connected to the drain of the first PMOS transistor; and when the source potential of the first PMOS transistor is lower than the drain potential, the gate drive unit making the gate potential of the first PMOS transistor equal to the drain potential, so that the first PMOS transistor comes into a reverse current suppression state; and a substrate switching unit, the first signal output end of the substrate switching unit being connected to the source of the first PMOS transistor, the second signal output end being connected to the substrate of the first PMOS transistor, and the third signal output end being connected to the drain of the first PMOS transistor; and when the source potential of the first PMOS transistor is lower than the drain potential, the substrate switching unit short-circuiting the substrate of the first PMOS transistor with the drain of the first PMOS transistor.

Further, when the source potential of the first PMOS transistor is higher than the drain potential and greater than an overvoltage protection value Vovp, the substrate switching unit short-circuits the substrate of the first PMOS transistor with the source of the first PMOS transistor; and the gate drive unit makes the gate potential of the first PMOS transistor equal to the source potential, so that the first PMOS transistor comes into a cut-off state.

When the source potential of the first PMOS transistor is higher than the drain potential and less than the overvoltage protection value Vovp, the substrate switching unit short-circuits the substrate of the first PMOS transistor with the source of the first PMOS transistor; and the gate drive unit outputs high resistance, so that the first PMOS transistor comes into a gate-source voltage controlled state.

Further, the gate drive unit includes second to seventh PMOS transistors (MP201 to MP206).

The source of the second PMOS transistor (MP201) is connected to the source of the third PMOS transistor (MP202), and the drain of the second PMOS transistor (MP201) is connected to the first signal output end of the gate drive unit.

The drain of the fourth PMOS transistor (MP203) is connected to the drain of the fifth PMOS transistor (MP204), and the source of the fifth PMOS transistor (MP204) is connected to the third signal output end of the gate drive unit.

The drain of the third PMOS transistor (MP202) is connected to the source of the fourth PMOS transistor (MP203) through a first resistor (R201), wherein the drain of the third PMOS transistor (MP202) is connected to the second signal output end of the gate drive unit.

The drain of the sixth PMOS transistor (MP205) is connected to the drain of the seventh PMOS transistor (MP206), the source of the sixth PMOS transistor (MP205) is connected to the gate of the third PMOS transistor (MP202), the gate of the sixth PMOS transistor (MP205) is connected to the gate of the fourth PMOS transistor (MP203), and all are controlled by a state control signal CTL. The source of the seventh PMOS transistor (MP206) is connected to the source of the fifth PMOS transistor (MP204), the gate of the seventh PMOS transistor (MP206) is connected to the gate of the fifth PMOS transistor (MP204), and all are controlled by a state selection signal SEL.

Further, the gate drive unit includes a first micro-constant current source (I201), a first diode (D201), a first NMOS (N-channel Metal Oxide Semiconductor) transistor (MN201), and a second NMOS transistor (MN202), wherein the first end of the first micro-constant current source (I201) is connected to the drain of the second PMOS transistor (MP201), the second end of the first micro-constant current source (I201) is connected to the anode of the first transistor (D201), and the cathode of the first transistor (D201) is connected to the gate of the third PMOS transistor (MP202).

The source of the first NMOS transistor (MN201) is connected to the drain of the second NMOS transistor (MN202), the drain of the first NMOS transistor (MN201) is connected to the cathode of the first diode (D201), the gate of the first NMOS transistor (MN201) is connected to the gate of the fourth PMOS transistor (MP203), and all are controlled by the state control signal CTL. The gate of the second NMOS transistor (MN202) is controlled by an overvoltage state signal EN, and the source of the second NMOS transistor (MN202) is connected to a floating signal FGND.

Further, the potential of the overvoltage state signal EN is as follows:

When the source potential of the first PMOS transistor is lower than the drain potential, $V_{EN}$ is equal to $V_{FGND}$, $V_{EN}$ being the potential of the overvoltage state signal EN. When the source potential of the first PMOS transistor is higher than the drain potential and less than the overvoltage protection value Vovp, $V_{EN}$ is equal to $V_{FGND}$, $V_{EN}$ being the potential of the overvoltage state signal EN and $V_{FGND}$ being the potential of the floating signal FGND. When the source potential of the first PMOS transistor is higher than the drain potential and greater than the overvoltage protection value Vovp, $V_{EN}$ is equal to Vs, Vs being the source potential of the first PMOS transistor.

Further, the substrate switching unit includes eighth to twelfth PMOS transistors (MP501 to MP505).

The drain of the eighth PMOS transistor (MP501) is connected to the first signal output end of the substrate switching unit. The source of the eighth PMOS transistor (MP501) is connected to the second signal output end of the substrate switching unit.

The source of the eighth PMOS transistor (MP501) is connected to the source of the ninth PMOS transistor (MP502) through a second resistor (R501), the drain of the ninth PMOS transistor (MP502) is connected to the drain of the tenth PMOS transistor (MP503), and the source of the tenth PMOS transistor (MP503) is connected to the third signal output end of the substrate switching unit.

The drain of the eleventh PMOS transistor (MP504) is connected to the drain of the twelfth PMOS transistor (MP505), the source of the eleventh PMOS transistor (MP504) is connected to the gate of the eighth PMOS transistor (MP501), the gate of the eleventh PMOS transistor (MP504) is connected to the gate of the ninth PMOS transistor (MP502), and all are controlled by the state control signal CTL. The source of the twelfth PMOS transistor (MP505) is connected to the source of the tenth PMOS transistor (MP503), the gate of the twelfth PMOS transistor (MP505) is connected to the gate of the tenth PMOS transistor (MP503), and all are controlled by the state selection signal SEL.

Further, the substrate switching unit includes a third NMOS transistor (MN501). The drain of the third NMOS transistor (MN501) is connected to the gate of the eighth PMOS transistor (MP501), the source of the third NMOS transistor (MN501) is connected to the floating signal FGND, the gate of the third NMOS transistor (MN501) is connected to the gate of the ninth PMOS transistor (MP502), and all are controlled by the state control signal CTL.

Further, the potential of the state selection signal SEL is as follows:

When the source potential of the first PMOS transistor is lower than the drain potential, $V_{SEL}$ is equal to 0V, $V_{SEL}$ being the potential of the state selection signal SEL. When the source potential of the first PMOS transistor is higher than the drain potential and less than the overvoltage protection value Vovp, $V_{SEL}$ is equal to Vd, $V_{SEL}$ being the potential of the state selection signal SEL and Vd being the drain potential of the first PMOS transistor. When the source potential of the first PMOS transistor is higher than the drain potential and greater than the overvoltage protection value Vovp, $V_{SEL}$ is equal to Vd.

Further, the state control signal CTL is generated by a state control signal CTL circuit, which includes a fourth NMOS transistor (MN401), a thirteenth PMOS transistor (MP401), a second micro-constant current source (I401), and a first Zener diode (DW401).

The two drains of the fourth NMOS transistor (MN401) and the thirteenth PMOS transistor (MP401) are connected and serve as the output end of the state control signal CTL circuit. The source of the fourth NMOS transistor (MN401) is connected to the floating signal FGND, and the gate of the fourth NMOS transistor (MN401) is controlled by the floating selection signal FSEL.

The source of the fourth NMOS transistor (MN401) is connected to the source of the first PMOS transistor. The source of the fourth NMOS transistor (MN401) is connected to the cathode of the first Zener diode (DW401), and the anode of the first Zener diode (DW401) is connected to the gate of the thirteenth PMOS transistor (MP401). The source of the fourth NMOS transistor (MN401) is connected to the first end of the second micro-constant current source (I401) through a third resistor (R401), the first end of the second micro-constant current source (I401) is connected to the gate of the thirteenth PMOS transistor (MP401), and the second end of the second micro-constant current source (I401) is grounded.

When the source potential of the first PMOS transistor is higher than the drain potential of the first PMOS transistor, the potential of the floating selection signal FSEL is equal to the potential of the floating signal FGND, and the output potential of the state control signal CTL circuit is equal to the source potential of the first PMOS transistor.

When the source potential of the first PMOS transistor is lower than the drain potential of the first PMOS transistor, the potential of the floating selection signal FSEL is higher to the potential of the floating signal FGND, and the output potential of the state control signal CTL circuit is equal to the potential of the floating signal FGND.

Further, the floating signal FGND is generated by a floating signal FGND circuit, which includes a fourteenth PMOS transistor (MP301), a third micro-constant current source (I301), a fourth micro-constant current source (I302), and a second Zener diode (DW301).

The source of the fourteenth PMOS transistor (MP301) and the first end of the third micro-constant current source (I301) are connected and serve as the output end of the floating signal FGND circuit, and the second end of the third micro-constant current source (I301) is connected to the source of the first PMOS transistor.

The gate of the fourteenth PMOS transistor (MP301) is connected to the anode of the second Zener diode (DW301) and the first end of the fourth micro-constant current source (I302). The cathode of the second Zener diode (DW301) is connected to the source of the first PMOS transistor, and the second end of the fourth micro-constant current source (I302) is grounded.

When the source potential of the first PMOS transistor is higher than the drain potential, the potential $V_{FGND}$ of the output end of the floating signal FGND circuit is obtained by the following formula:

$$V_{FGND}=VS-(Vz-V_T)$$

wherein Vs is the source potential of the first PMOS transistor, Vz is the Zener voltage of the second Zener diode DW301, and $V_T$ is the gate-source threshold voltage of the fourteenth PMOS transistor MP301.

When the source potential of the first PMOS transistor is lower than the drain potential, the potential of the output end of the floating signal FGND circuit is:

$$V_{FGND}=V_T.$$

Advantages of the Present Invention

Since the present invention includes the gate drive unit and the substrate switching unit, when the source potential of the first PMOS transistor is lower than the drain potential, the substrate switching unit short-circuits the substrate of the first PMOS transistor with the drain of the first PMOS transistor, and the gate drive unit makes the gate potential of the first PMOS transistor equal to the drain potential, so that the first PMOS transistor comes into the reverse current suppression state, thus realizing effective protection for the first PMOS transistor.

According to the present invention, when the source potential of the first PMOS transistor is higher than the drain potential and greater than the overvoltage protection value Vovp, the substrate switching unit short-circuits the substrate of the first PMOS transistor with the source of the first PMOS transistor; and the gate drive unit makes the gate potential of the first PMOS transistor equal to the source potential, so that the first PMOS transistor comes into the cut-off state, thus further realizing overvoltage protection for the first PMOS transistor.

According to the present invention, since the gate drive unit and the substrate switching unit include the floating signal FGND circuit and the state control signal CTL circuit, which correspondingly generate the floating signal FGND and the state control signal CTL, the specific circuit design is unique, simple and easy to integrate, thus further ensuring the reliability of controlling the operating state of the first PMOS transistor and realizing effective protection for the first PMOS transistor.

DETAILED DESCRIPTION OF THE INVENTION

The present invention will be described in detail with reference to the various embodiments shown in the following accompanying drawings. However, it should be pointed out that these embodiments do not constitute a limitation to the present invention, and all equivalent changes or substitutions of functions, methods or structures made by those of ordinary skill in the art according to these embodiments shall fall within the protection scope of the present invention.

Figure 1:
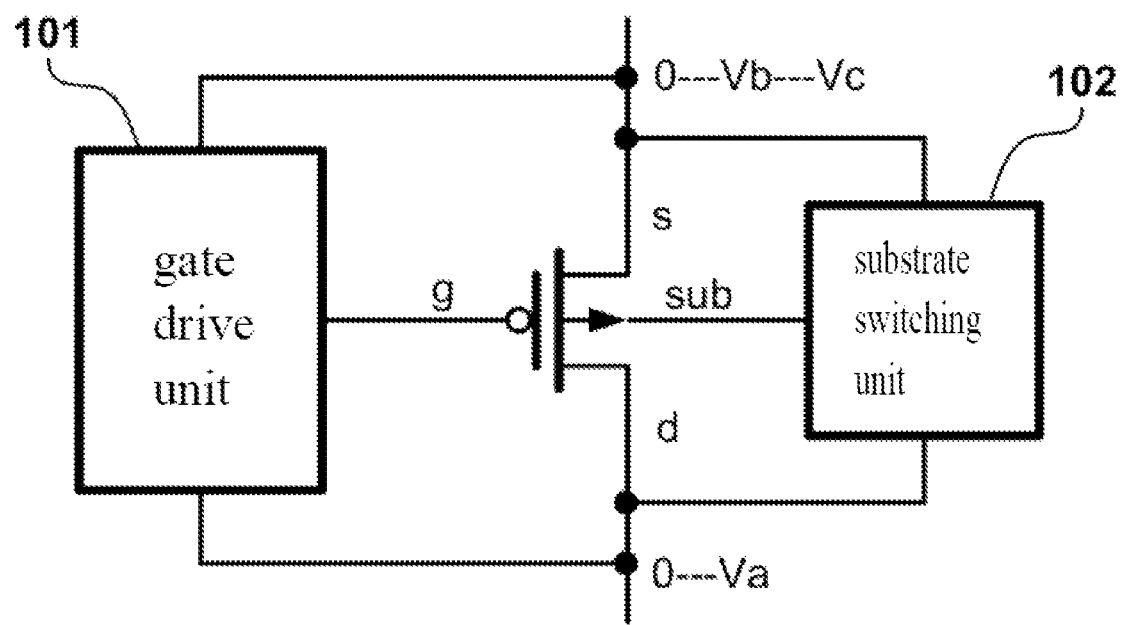
FIG. 1 is a schematic circuit block diagram of the present invention.

As shown in FIG. 1, a reverse current suppression circuit for a high voltage-withstanding thin gate oxide PMOS transistor according to the present invention includes:

a gate drive unit 101, the first signal output end of the gate drive unit being connected to the source s of the first PMOS transistor, the second signal output end being connected to the gate g of the first PMOS transistor, and the third signal output end being connected to the drain d of the first PMOS transistor; and when the source potential of the first PMOS transistor is lower than the drain potential, the gate drive unit making the gate potential of the first PMOS transistor equal to the drain potential, so that the first PMOS transistor comes into a reverse current suppression state; and a substrate switching unit 102, the first signal output end of the substrate switching unit being connected to the source s of the first PMOS transistor, the second signal output end being connected to the substrate sub of the first PMOS transistor, and the third signal output end being connected to the drain d of the first PMOS transistor; and when the source potential of the first PMOS transistor is lower than the drain potential, the substrate switching unit short-circuiting the substrate of the first PMOS transistor with the drain of the first PMOS transistor.

When the source potential of the first PMOS transistor is higher than the drain potential and greater than an overvoltage protection value Vovp, the substrate switching unit short-circuits the substrate of the first PMOS transistor with the source of the first PMOS transistor; and the gate drive unit makes the gate potential of the first PMOS transistor equal to the source potential, so that the first PMOS transistor comes into a cut-off state.

When the source potential of the first PMOS transistor is higher than the drain potential and less than the overvoltage protection value Vovp, the substrate switching unit short-circuits the substrate of the first PMOS transistor with the source of the first PMOS transistor; and the gate drive unit outputs high resistance, so that the first PMOS transistor comes into a gate-source voltage controlled state (controlled by another route of driving signal).

Figure 2:
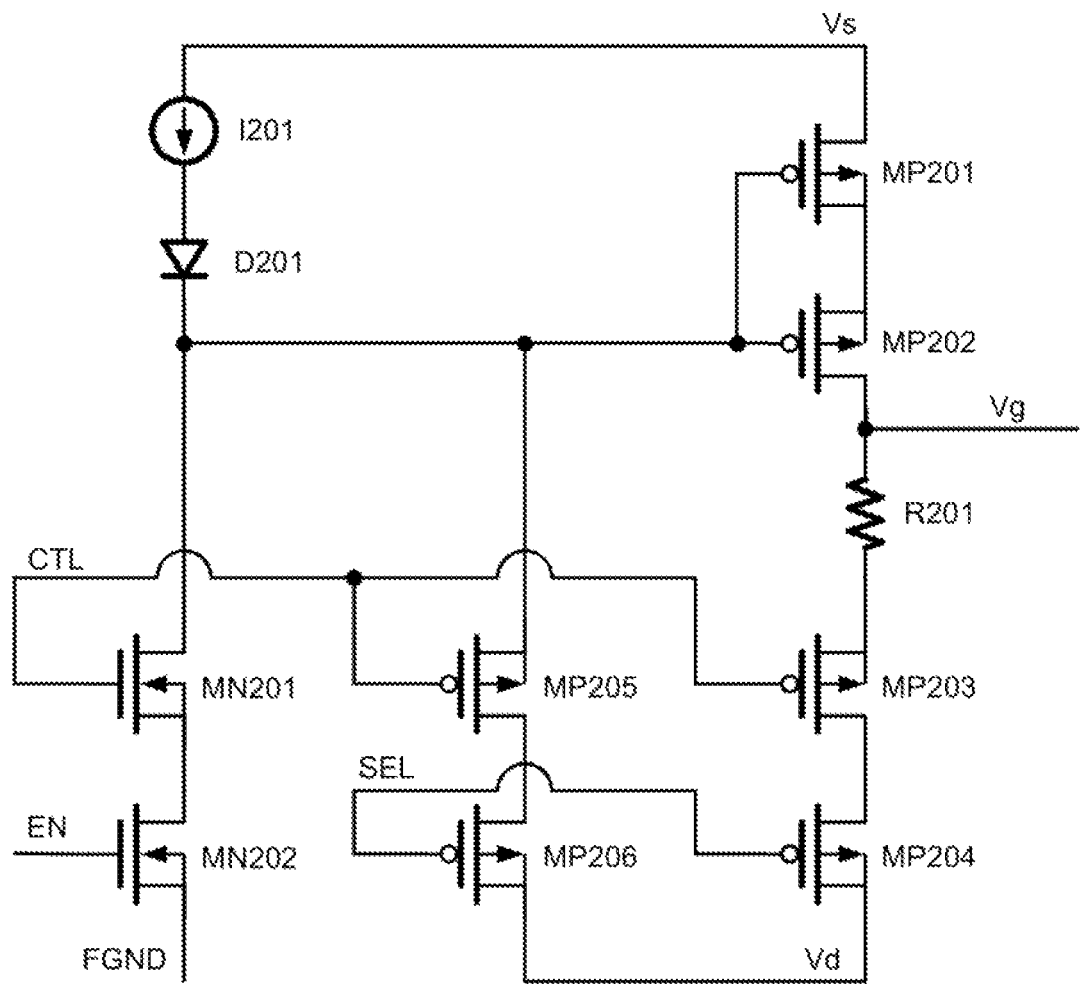
FIG. 2 is a schematic circuit diagram of a gate drive unit according to the present invention.

As shown in FIG. 2, the gate drive unit includes second to seventh PMOS transistors MP201 to MP206. The source of the second PMOS transistor MP201 is connected to the source of the third PMOS transistor MP202, the drain of the second PMOS transistor MP201 is connected to the first signal output end of the gate drive unit, the drain of the fourth PMOS transistor MP203 is connected to the drain of the fifth PMOS transistor MP204, the source of the fifth PMOS transistor MP204 is connected to the third signal output end of the gate drive unit, the drain of the third PMOS transistor MP202 is connected to the source of the fourth PMOS transistor MP203 through a first resistor 8201, wherein the drain of the third PMOS transistor MP202 is connected to the second signal output end of the gate drive unit. The drain of the sixth PMOS transistor MP205 is connected to the drain of the seventh PMOS transistor MP206, the source of the sixth PMOS transistor MP205 is connected to the gate of the third PMOS transistor MP202, the gate of the sixth PMOS transistor MP205 is connected to the gate of the fourth PMOS transistor MP203, and all are controlled by a state control signal CTL. The source of the seventh PMOS transistor MP206 is connected to the source of the fifth PMOS transistor MP204, the gate of the seventh PMOS transistor MP206 is connected to the gate of the fifth PMOS transistor MP204, and all are controlled by a state selection signal SEL.

The gate drive unit includes a first micro-constant current source I201, a first diode D201, a first NMOS (N-channel Metal Oxide Semiconductor) transistor MN201, and a second NMOS transistor MN202, wherein the first end of the first micro-constant current source I201 is connected to the drain of the second PMOS transistor MP201, the second end of the first micro-constant current source I201 is connected to the anode of the first transistor D201, and the cathode of the first transistor D201 is connected to the gate of the third PMOS transistor MP202.

The source of the first NMOS transistor MN201 is connected to the drain of the second NMOS transistor MN202, the drain of the first NMOS transistor MN201 is connected to the cathode of the first diode D201, the gate of the first NMOS transistor MN201 is connected to the gate of the fourth PMOS transistor MP203, and all are controlled by the state control signal CTL. The source of the second NMOS transistor MN202 is connected to a floating signal FGND, and the gate of the second NMOS transistor MN202 is controlled by an overvoltage state signal EN.

Figure 5:
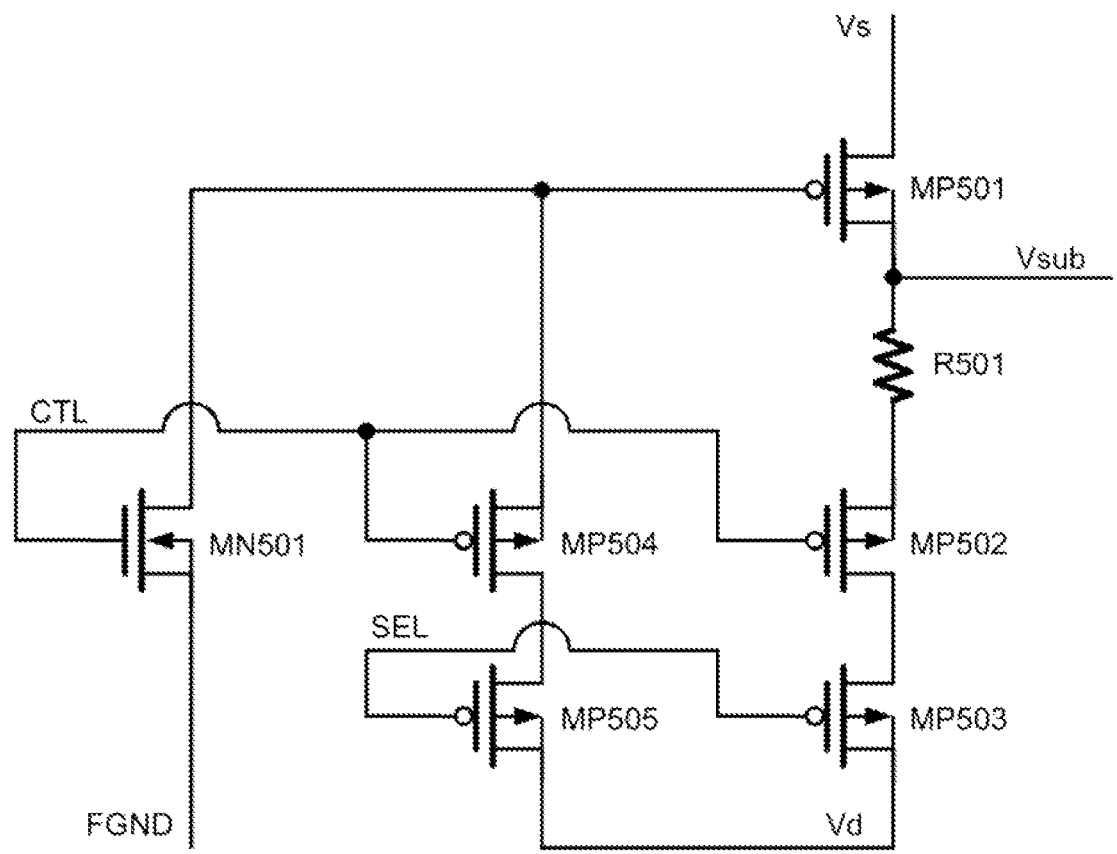
FIG. 5 is a schematic circuit diagram of a substrate switching unit according to the present invention.

As shown in FIG. 5, the substrate switching unit includes eighth to twelfth PMOS transistors MP501 to MP205. The drain of the eighth PMOS transistor MP501 is connected to the first signal output end of the substrate switching unit. The source of the eighth PMOS transistor MP501 is connected to the second signal output end of the substrate switching unit. The source of the eighth PMOS transistor MP501 is connected to the source of the ninth PMOS transistor MP502 through a second resistor R501, the drain of the ninth PMOS transistor MP502 is connected to the drain of the tenth PMOS transistor MP503, and the source of the tenth PMOS transistor MP503 is connected to the third signal output end of the substrate switching unit. The drain of the eleventh PMOS transistor MP504 is connected to the drain of the twelfth PMOS transistor MP505, the source of the eleventh PMOS transistor MP504 is connected to the gate of the eighth PMOS transistor MP501, the gate of the eleventh PMOS transistor MP504 is connected to the gate of the ninth PMOS transistor MP502, and all are controlled by the state control signal CTL. The source of the twelfth PMOS transistor MP505 is connected to the source of the tenth PMOS transistor MP503, the gate of the twelfth PMOS transistor MP505 is connected to the gate of the tenth PMOS transistor MP503, and all are controlled by the state selection signal SEL. The substrate switching unit includes a third NMOS transistor MN501. The drain of the third NMOS transistor MN501 is connected to the gate of the eighth PMOS transistor MP501, the source of the third NMOS transistor MN501 is connected to the floating signal FGND, the gate of the third NMOS transistor MN501 is connected to the gate of the ninth PMOS transistor MP502, and all are controlled by the state control signal CTL.

Figure 3:
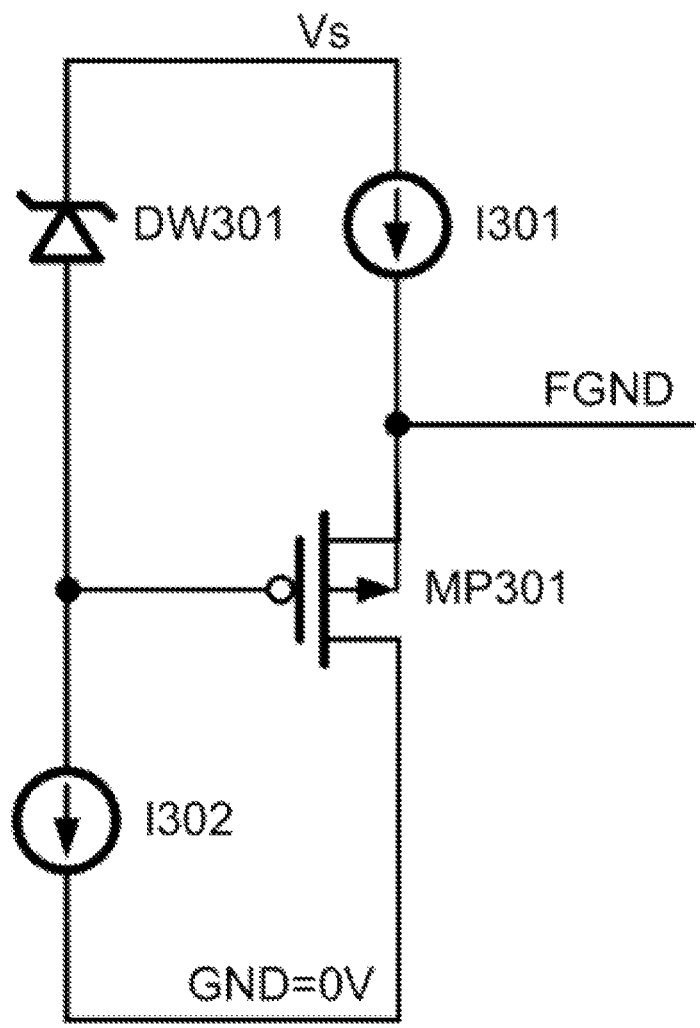
FIG. 3 is a schematic circuit diagram of a floating signal FGND circuit according to the present invention.

The details of the floating signal FGND, the state control signal CTL, the state selection signal SEL and the overvoltage state signal EN included in the aforementioned circuit are as follows:

As shown in FIG. 3, the floating signal FGND is generated by a floating signal FGND circuit, which includes a fourteenth PMOS transistor MP301, a third micro-constant current source I301, a fourth micro-constant current source I302, and a second Zener diode DW301, the source of the fourteenth PMOS transistor MP301 and the first end of the third micro-constant current source I301 are connected and serve as the output end of the floating signal FGND circuit, and the second end of the third micro-constant current source I301 is connected to the source of the first PMOS transistor. The gate of the fourteenth PMOS transistor MP301 is connected to the anode of the second Zener diode DW301 and the first end of the fourth micro-constant current source I302. The cathode of the second Zener diode DW301 is connected to the source of the first PMOS transistor, and the second end of the fourth micro-constant current source I302 is grounded.

When the source potential of the first PMOS transistor is higher than the drain potential, the potential $V_{FGND}$ of the output end of the floating signal FGND circuit is obtained by the following formula:

$$V_{FGND}=Vs-(Vz-V_T)$$

wherein Vs is the source potential of the first PMOS transistor, Vz is the Zener voltage of the second Zener diode DW301, and $V_T$ is the gate-source threshold voltage of the fourteenth PMOS transistor MP301.

When the source potential of the first PMOS transistor is lower than the drain potential, the potential of the output end of the floating signal FGND circuit is:

$$V_{FGND}=V_T.$$

Figure 4:
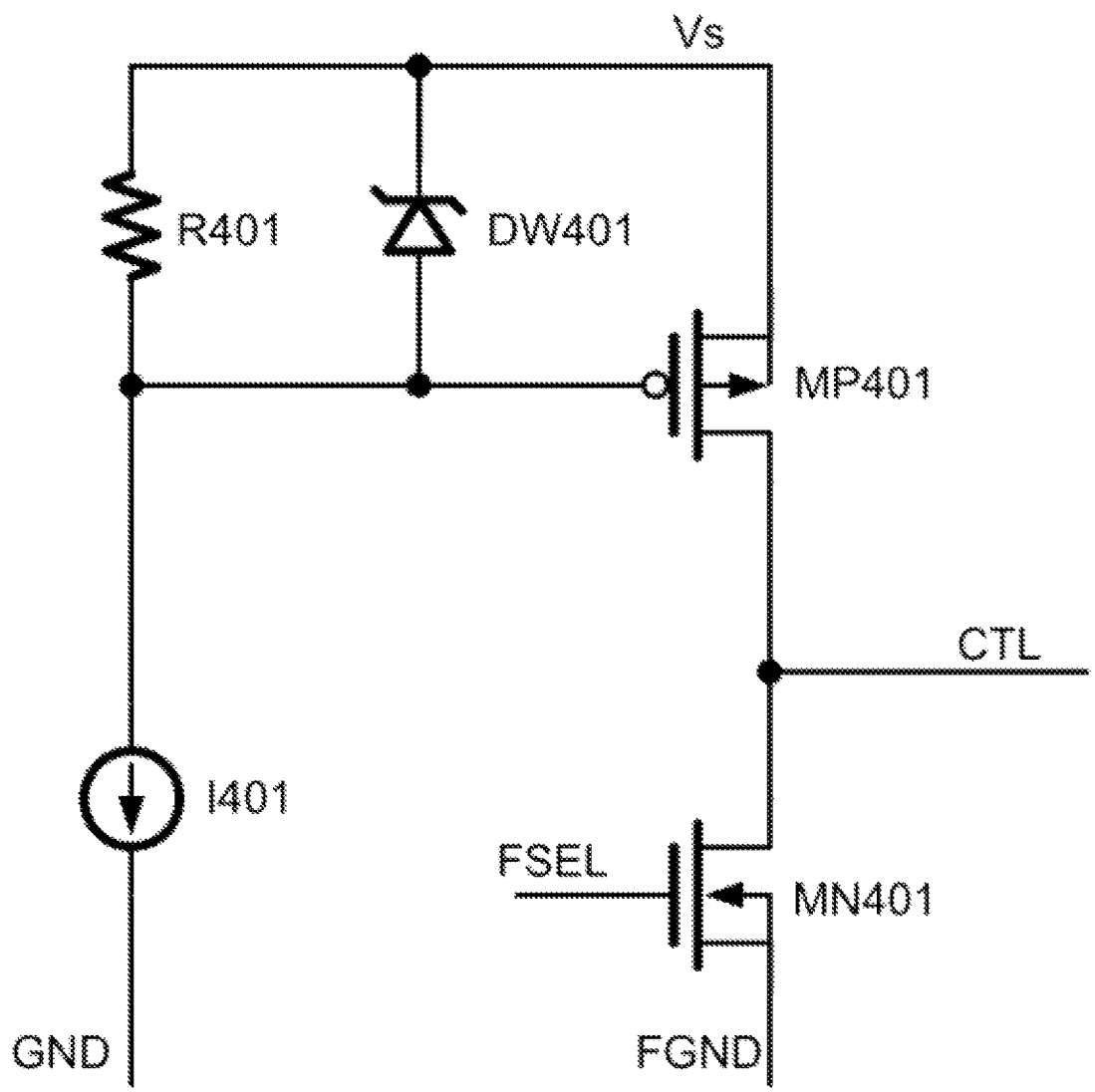
FIG. 4 is a schematic circuit diagram of a state control signal CTL circuit according to the present invention.

As shown in FIG. 4, the state control signal CTL is generated by a state control signal CTL circuit, which includes a fourth NMOS transistor MN401, a thirteenth PMOS transistor MP401, a second micro-constant current source I401, and a first Zener diode DW401. The two drains of the fourth NMOS transistor MN401 and the thirteenth PMOS transistor MP401 are connected and serve as the output end of the state control signal CTL circuit. The source of the fourth NMOS transistor MN401 is connected to the floating signal FGND, and the gate of the fourth NMOS transistor MN401 is controlled by the floating selection signal FSEL. The source of the fourth NMOS transistor MN401 is connected to the source of the first PMOS transistor. The source of the fourth NMOS transistor MN401 is connected to the cathode of the first Zener diode DW401, and the anode of the first Zener diode DW401 is connected to the gate of the thirteenth PMOS transistor MP401. The source of the fourth NMOS transistor MN401 is connected to the first end of the second micro-constant current source I401 through a third resistor R401, the first end of the second micro-constant current source I401 is connected to the gate of the thirteenth PMOS transistor MP401, and the second end of the second micro-constant current source I401 is grounded. When the source potential of the first PMOS transistor is higher than the drain potential of the first PMOS transistor, the potential of the floating selection signal FSEL is equal to that of the floating signal FGND, and the output potential of the state control signal CTL circuit is equal to the source potential of the first PMOS transistor. When the source potential of the first PMOS transistor is lower than the drain potential of the first PMOS transistor, the potential of the floating selection signal FSEL is higher than that of the floating signal FGND, and the output potential of the state control signal CTL circuit is equal to the potential of the floating signal FGND. The function of the first Zener diode DW401 is to clamp the voltage difference between the source and the gate of the thirteenth PMOS transistor MP401 to the Zener voltage of the first Zener diode DW401 when the thirteenth PMOS transistor MP401 is turned on, so as to protect the gate oxide layer of the thirteenth PMOS transistor MP401.

The potential of the state selection signal SEL is as follows:

When the source potential of the first PMOS transistor is lower than the drain potential, $V_{SEL}$ is equal to 0V, $V_{SEL}$ being the potential of the state selection signal SEL. When the source potential of the first PMOS transistor is higher than the drain potential and less than the overvoltage protection value Vovp, $V_{SEL}$ is equal to Vd, $V_{SEL}$ being the potential of the state selection signal SEL and Vd being the drain potential of the first PMOS transistor. When the source potential of the first PMOS transistor is higher than the drain potential and greater than the overvoltage protection value Vovp, $V_{SEL}$ is equal to Vd.

The potential of the overvoltage state signal EN is as follows:

When the source potential of the first PMOS transistor is lower than the drain potential, $V_{EN}$ is equal to $V_{FGND}$, $V_{EN}$ being the potential of the overvoltage state signal EN. When the source potential of the first PMOS transistor is higher than the drain potential and less than the overvoltage protection value Vovp, $V_{EN}$ is equal to $V_{FGND}$, $V_{EN}$ being the potential of the overvoltage state signal EN and $V_{FGND}$ being the potential of the floating signal FGND. When the source potential of the first PMOS transistor is higher than the drain potential and greater than the overvoltage protection value Vovp, $V_{EN}$ is equal to Vs, Vs being the source potential of the first PMOS transistor.

As shown in FIG. 1, the potential of the drain d of the first PMOS transistor is 0 to Va, the maximum value Va is less than a withstandable gate-substrate voltage, and the potential of the source s is lower than the potential of the drain d. The substrate switching unit 102 short-circuits the substrate sub of the first PMOS transistor with the drain d of the first PMOS transistor. The gate drive unit 101 makes the potential of the gate g of the first PMOS transistor equal to the potential of the drain d of the first PMOS transistor, so that the first PMOS transistor comes into a reverse cut-off state, i.e. a reverse current suppression state, with only little or no current flowing between the drain and the source.

When the potential of the drain g of the first PMOS transistor is 0 to Va and the potential Vb of the source s of the first PMOS transistor is higher than the drain potential of the first PMOS transistor and less than the overvoltage protection value Vovp, the overvoltage protection value Vovp is less than a withstandable gate-substrate voltage of the first PMOS transistor, and the substrate switching unit 102 short-circuits the substrate sub of the first PMOS transistor with the source s of the first PMOS transistor; the gate drive unit 101 outputs a high impedance state, the gate-source voltage of the first PMOS transistor comes from another route of driving signal (not shown in FIG. 1), and the first PMOS transistor comes into a gate-source voltage controlled state, controlled by a normal driving signal.

When the drain potential of the first PMOS transistor is 0 to Va and the source potential Vc of the first PMOS transistor is higher than the drain potential and greater than the overvoltage protection value Vovp, the substrate switching unit 102 still keeps the substrate of the first PMOS transistor short-circuited with the source of the first PMOS transistor; and the gate drive unit 101 makes the gate-source voltage of the first PMOS transistor 0V, so that the first PMOS transistor comes into the cut-off state.

As shown in FIG. 2, when the source potential of the first PMOS transistor is lower than the drain potential (Vs<Vd), $V_{CTL}$ is equal to $V_{FGND}$, $V_{EN}$ is equal to $V_{FGND}$, and $V_{SEL}$ is equal to 0V. At this point, the PMOS transistors MP203, MP204, MP205 and MP206 are turned on; the NMOS transistors MN201 and MN202 are turned off; the gate potentials of the PMOS transistors MP201 and MP202 are pulled to Vd by the PMOS transistors MP205 and MP206, the PMOS transistors MP201 and MP202 are turned off, the gate potential Vg of the first PMOS transistor is equal to Vd, and the first PMOS transistor comes into the reverse turn-off state, i.e. the reverse current suppression state, with only little or no current flowing between the drain and the source. The function of the diode D201 is to prevent Vd from injecting current to Vs when the gate potentials of the PMOS transistors MP201 and MP202 are pulled to Vd.

When the source potential of the first PMOS transistor is higher than the drain potential (Vs>Vd) and the first PMOS transistor is not in an overvoltage state, $V_{CTL}$ is equal to Vs, $V_{EN}$ is equal to $V_{FGND}$, and $V_{SEL}$ is equal to Vd. At this point, the PMOS transistors MP203, MP204, MP205 and MP206 are turned off, the NMOS transistor MN201 is turned on, the NMOS transistor MN202 is turned off, the gate potentials of the PMOS transistors MP201 and MP202 are pulled to Vs by the micro-constant current source I201, and the MOS transistors MP201 and MP202 are turned off. Since the PMOS transistors MP203 and MP204 and the PMOS transistors MP201 and MP202 are in the cut-off state, the gate potential Vg of the first PMOS transistor comes from another route of driving signal (not shown in FIG. 2), and the first PMOS transistor is controlled by the normal driving signal.

When the source potential of the first PMOS transistor is higher than the drain potential (Vs>Vd) and the first PMOS transistor is in the overvoltage state, $V_{CTL}$ is equal to Vs, $V_{EN}$ is equal to Vs, and $V_{SEL}$ is equal to Vd. At this point, the PMOS transistors MP203, MP204, MP205 and MP206 are turned off, the NMOS transistors MN201 and MN202 are turned on, the gate potentials of the PMOS transistors MP201 and MP202 are pulled down to $V_{FGND}$, the PMOS transistors MP201 and MP202 are turned on, and the gate potential Vg of the first PMOS transistor is equal to Vs, so that the first PMOS transistor is turned off. The purpose of short-circuiting the substrate ends of the PMOS transistors MP201 and MP202 is to prevent Vd from injecting current to Vs through a diode formed by the source s and the substrate sub of the first PMOS transistor when the PMOS transistors MP201 and MP202 are turned off. The function of the resistor R201 is to prevent the drain d of the first PMOS transistor from injecting current into the source s at the moment when the PMOS transistors MP201 and MP202 are switched from the "on" state and to the "off" state and the PMOS transistors MP203 and MP204 are switched from the "off" state to the "on" state, thus limiting the current.

As shown in FIG. 5, when the source potential of the PMOS transistor is higher than the drain potential (Vs>Vd), $V_{CTL}$ is equal to Vs, and $V_{SEL}$ is equal to Vd. At this point, the MOS transistors MP502, MP503, MP504 and MP505 are turned off, the MOS transistor MN501 is turned on, the gate potential of the MOS transistor MP501 is pulled down to $V_{FGND}$, and the MOS transistor MP501 is turned on. Therefore, the substrate of PMOS is short-circuited with the source, and $V_{sub}$ is equal to Vs.

When the source potential of the first PMOS transistor is lower than the drain potential (Vs<Vd), $V_{CTL}$ is equal to $V_{FGND}$, and $V_{SEL}$ is equal to 0V. At this point, the PMOS transistors MP502, MP503, MP504 and MP505 are turned on, the NMOS transistor MN501 is turned off, and the gate potential of the PMOS transistor MP501 is pulled to Vd by the PMOS transistors MP504 and MP505, so that the PMOS transistor MP501 is turned off. The substrate of the first PMOS transistor is short-circuited with the drain of the first PMOS transistor, and $V_{sub}=Vd$. The function of the resistor R501 is to prevent the drain d of the first PMOS transistor from injecting current into the source s when the PMOS transistor MP501 is switched from the "on" state and to the "off" state and the PMOS transistors MP502 and MP503 are switched from the "off" state and to the "on" state, thus limiting the current.

For those skilled in the art, apparently, the present invention is not limited to the details of the above-mentioned exemplary embodiments, and moreover, without departing from the spirit or basic features of the present invention, the present invention can be implemented in other specific forms. Therefore, from any point of view, the embodiments should be regarded as being exemplary and non-limiting, the scope of the present invention is defined by the attached claims rather than the above-mentioned description, so the objective is to include all changes falling within the meanings and scopes of the equivalent elements of the claims into the present invention.

The invention claimed is:

1. A reverse current suppression circuit for a first PMOS transistor, the first PMOS transistor being a thin gate oxide PMOS transistor, the reverse current suppression circuit comprising:
 a gate drive unit, a first end of said gate drive unit being connected to a source of the first PMOS transistor, a second end being connected to a gate of the first PMOS transistor, and a third end being connected to a drain of the first PMOS transistor, wherein when a source potential of the first PMOS transistor is lower than a drain potential, said gate drive unit makes the gate potential of the first PMOS transistor equal to the drain potential so that the first PMOS transistor goes into a reverse current suppression state; and
 a substrate switching unit, a first end of said substrate switching unit being connected to the source of the first PMOS transistor, a second end of said substrate switching unit being connected to a substrate of the first PMOS transistor, and a third end of said substrate switching unit being connected to the drain of the first PMOS transistor such that when the source potential of the first PMOS transistor is lower than the drain potential, the substrate switching unit short-circuits the substrate of the first PMOS transistor with the drain of the first PMOS transistor, wherein when the source potential of the first PMOS transistor is higher than the drain potential and greater than an overvoltage protection value ($V_{ovp}$), said substrate switching unit short-circuits the substrate of the first PMOS transistor with the source of the first PMOS transistor and the gate drive unit makes the gate potential of the first PMOS transistor equal to the source potential so that the first PMOS transistor goes into a cut-off state, when the source potential of the first PMOS transistor is higher than the drain potential and less than the overvoltage protection value ($V_{ovp}$), the substrate switching unit short-circuits the substrate of the first PMOS transistor with the source of the first PMOS transistor and the gate drive unit creates a high resistance between the gate and source of the first PMOS transistor so that the first PMOS transistor goes into a gate-source voltage controlled state.

2. A reverse current suppression circuit for a first PMOS transistor, the first PMOS transistor being a thin gate oxide PMOS transistor, the reverse current suppression circuit comprising:
 a gate drive unit, a first end of said gate drive unit being connected to a source of the first PMOS transistor, a second end being connected to a gate of the first PMOS transistor, and a third end being connected to a drain of the first PMOS transistor, wherein when a source potential of the first PMOS transistor is lower than a drain potential, said gate drive unit makes the gate potential of the first PMOS transistor equal to the drain potential so that the first PMOS transistor goes into a reverse current suppression state; and
 a substrate switching unit, a first end of said substrate switching unit being connected to the source of the first PMOS transistor, a second end of said substrate switching unit being connected to a substrate of the first PMOS transistor, and a third end of said substrate switching unit being connected to the drain of the first PMOS transistor such that when the source potential of the first PMOS transistor is lower than the drain potential, the substrate switching unit short-circuits the substrate of the first PMOS transistor with the drain of the first PMOS transistor, wherein the gate drive unit comprises second to seventh PMOS transistors, the a source of the second PMOS transistor is connected to a source of the third PMOS transistor, and a drain of the second PMOS transistor is connected to the first end of said gate drive unit, a drain of the fourth PMOS transistor is connected to a drain of the fifth PMOS transistor, a source of the fifth PMOS transistor being connected to a third end of said gate drive unit, a drain of the third PMOS transistor is connected to a source of the fourth PMOS transistor through a first resistor, wherein the drain of the third PMOS transistor is connected to the second end of said gate drive unit, a drain of the sixth PMOS transistor is connected to a drain of the seventh PMOS transistor, a source of the sixth PMOS transistor is connected to a gate of the third PMOS transistor, a gate of the sixth PMOS transistor is connected to a gate of the fourth PMOS transistor, wherein the fourth and sixth PMOS transistors are controlled by a state control signal CTL, a source of the seventh PMOS transistor is connected to a source of the fifth PMOS transistor, a gate of the seventh PMOS transistor is connected to a gate of the fifth PMOS transistor, wherein the fifth and seventh PMOS transistors are controlled by a state selection signal SEL.

3. The reverse current suppression circuit of claim 2, wherein said gate drive unit comprises a first micro-constant current source, a first diode, a first NMOS transistor, and a second NMOS transistor, wherein a first end of the first micro-constant current source is connected to the drain of the second PMOS transistor, a second end of the first micro-constant current source is connected to an anode of the first diode and a cathode of the first diode is connected to the gate of the third PMOS transistor, a source of the first NMOS transistor is connected to the drain of the second NMOS transistor, a drain of the first NMOS transistor is connected to the cathode of the first diode, a gate of the first NMOS transistor is connected to the gate of the fourth PMOS transistor, wherein the first NMOS transistor and the fourth PMOS transistor are controlled by the state control signal CTL a gate of the second NMOS transistor is controlled by an overvoltage state signal EN, and a source of the second NMOS transistor is connected to a floating signal FGND.

4. The reverse current suppression circuit of claim 3, wherein a potential of the overvoltage state signal EN is as follows:

when the source potential of the first PMOS transistor is lower than the drain potential, $V_{EN}$ is equal to $V_{FGND}$, $V_{EN}$ being a potential of the overvoltage state signal EN and $V_{FGND}$ being a potential of the floating signal FGND, when the source potential of the first PMOS transistor is higher than the drain potential and less than an overvoltage protection value ($V_{ovp}$), $V_{EN}$ is equal to $V_{FGND}$, when the source potential of the first PMOS transistor is higher than the drain potential and greater than the overvoltage protection value $V_{OVP}$, $V_{EN}$ is equal to Vs, Vs being the source potential of the first PMOS transistor.

5. The reverse current suppression circuit of claim 4, wherein said substrate switching unit comprises eighth to twelfth PMOS transistors,
a drain of the eighth PMOS transistor is connected to the first end of said substrate switching unit, a source of the eighth PMOS transistor is connected to the second end of the substrate switching unit, the source of the eighth PMOS transistor is connected to a source of the ninth PMOS transistor through a second resistor, a drain of the ninth PMOS transistor is connected to a drain of the tenth PMOS transistor, a source of the tenth PMOS transistor being connected to the third end of said substrate switching unit, a drain of the eleventh PMOS transistor is connected to a drain of the twelfth PMOS transistor, a source of the eleventh PMOS transistor is connected to a gate of the eighth PMOS transistor, a gate of the eleventh PMOS transistor is connected to a gate of the ninth PMOS transistor, wherein the ninth and eleventh PMOS transistors are controlled by the state control signal CTL a source of the twelfth PMOS transistor is connected to a source of the tenth PMOS transistor, a gate of the twelfth PMOS transistor is connected to a gate of the tenth PMOS transistor, wherein the tenth and twelfth PMOS transistors are controlled by the state selection signal SEL.

6. The reverse current suppression circuit of claim 5, wherein said substrate switching unit comprises a third NMOS transistor a drain of the third NMOS transistor being connected to the gate of the eighth PMOS transistor, a source of the third NMOS transistor being connected to the floating signal FGND, a gate of the third NMOS transistor being connected to the gate of the ninth PMOS transistor, wherein the third NMOS and ninth PMOS transistors are controlled by the state control signal CTL.

7. The reverse current suppression circuit of claim 2, wherein a potential of the state selection signal SEL is as follows:
when the source potential of the first PMOS transistor is lower than the drain potential, $V_{SEL}$ is equal to 0V, $V_{SEL}$ being the potential of the state selection signal SEL; when the source potential of the first PMOS transistor is higher than the drain potential and less than an overvoltage protection value $V_{ovp}$, $V_{SEL}$ is equal to Vd, Vd being the drain potential of the first PMOS transistor, and when the source potential of the first PMOS transistor is higher than the drain potential and greater than the overvoltage protection value Vovp, $V_{SEL}$ is equal to Vd.

8. The reverse current suppression circuit of claim 6, wherein the state control signal CTL is generated by a state control signal CTL circuit, the state control signal CTL circuit comprising a fourth NMOS transistor, a thirteenth PMOS transistor, a second micro-constant current source, and a first Zener diode wherein drains of the fourth NMOS transistor and the thirteenth PMOS transistor are connected and serve as an output end of the state control signal CTL circuit a source of the fourth NMOS transistor being connected to the floating signal FGND, a gate of the fourth NMOS transistor being controlled by a floating selection signal FSEL, the source of the thirteenth PMOS transistor being connected to the source of the first PMOS transistor, the source of the thirteenth PMOS transistor is connected to a cathode of the first Zener diode, an anode of the first Zener diode being connected to a gate of the thirteenth PMOS transistor, the source of the thirteenth PMOS transistor being connected to a first end of the second micro-constant current source through a third resistor, the first end of the second micro-constant current source being connected to the gate of the thirteenth PMOS transistor, wherein a second end of the second micro-constant current source is grounded, when the source potential of the first PMOS transistor is higher than the drain potential of the first PMOS transistor, a potential of the floating selection signal FSEL is equal to the potential of the floating signal FGND, and an output potential of the state control signal CTL circuit is equal to the source potential of the first PMOS transistor, when the source potential of the first PMOS transistor is lower than the drain potential of the first PMOS transistor, the potential of the floating selection signal FSEL is higher to the potential of the floating signal FGND, and the output potential of the state control signal CTL circuit is equal to the potential of the floating signal FGND.

9. The reverse current suppression circuit of claim 8, wherein the floating signal FGND is generated by a floating signal FGND circuit, the floating signal FGND circuit comprising a fourteenth PMOS transistor, a third micro-constant current source, a fourth micro-constant current source, and a second Zener diode, a source of the fourteenth PMOS transistor and a first end of the third micro-constant current source are connected and serve as an output end of the floating signal FGND circuit, a second end of the third micro-constant current source is connected to the source of the first PMOS transistor, a gate of the fourteenth PMOS transistor is connected to an anode of the second Zener diode and a first end of the fourth micro-constant current source a cathode of the second Zener diode is connected to the source of the first PMOS transistor, a second end of the fourth micro-constant current source is grounded, when the source potential of the first PMOS transistor is higher than the drain potential, the potential $V_{FGND}$ of the output end of the floating signal FGND circuit is obtained by the following formula:

$$V_{FGND}=Vs-(Vz-V_T)$$

wherein Vs is the source potential of the first PMOS transistor, Vz is a Zener voltage of the second Zener diode, and $V_T$ is a gate-source threshold voltage of the fourteenth PMOS transistor, when the source potential of the first PMOS transistor is lower than the drain potential, a potential of the output end of the floating signal FGND circuit is:

$$V_{FGND}=V_T.$$

* * * * *